United States Patent [19]

Young

[11] 4,454,474
[45] Jun. 12, 1984

[54] NUCLEAR MAGNETIC RESONANCE SYSTEMS

[75] Inventor: Ian R. Young, Middlesex, England

[73] Assignee: Picker International Limited, Wembley, England

[21] Appl. No.: 330,215

[22] Filed: Dec. 14, 1981

[30] Foreign Application Priority Data

Jan. 7, 1981 [GB] United Kingdom ............... 8100369

[51] Int. Cl.³ ............................................ G01R 33/08
[52] U.S. Cl. ...................................... 324/309; 324/313
[58] Field of Search ............... 324/300, 307, 309, 313, 324/314

[56] References Cited

U.S. PATENT DOCUMENTS 4,284,948  8/1981  Young .................... 324/313
4,297,637 10/1981  Crooks ................... 324/307
4,339,716  7/1982  Young .................... 324/309

Primary Examiner—Michael J. Tokar
Attorney, Agent, or Firm—Watts, Hoffmann, Fisher & Heinke Co.

[57] ABSTRACT

A method of examining a slice of a body by nuclear magnetic resonance in which a steady magnetic field, and a gradient field $G_z$ along the same axis define the slice to be examined. A periodic magnetic field $H_1$ at the Larmor frequency for the slice is applied in two distinct pulses 1, 2 each in conjunction with the gradient field. The total field integral of the two pulses is chosen to be sufficient to rotate spin vectors of nuclei in the field through an angle of $\pi/2$ radians. Between the two pulses 1, 2, a further pulse 3 is applied in the absence of the gradient field $G_z$, which has a field integral sufficient to rotate the spin vectors through an angle of $\pi$ radians.

8 Claims, 7 Drawing Figures

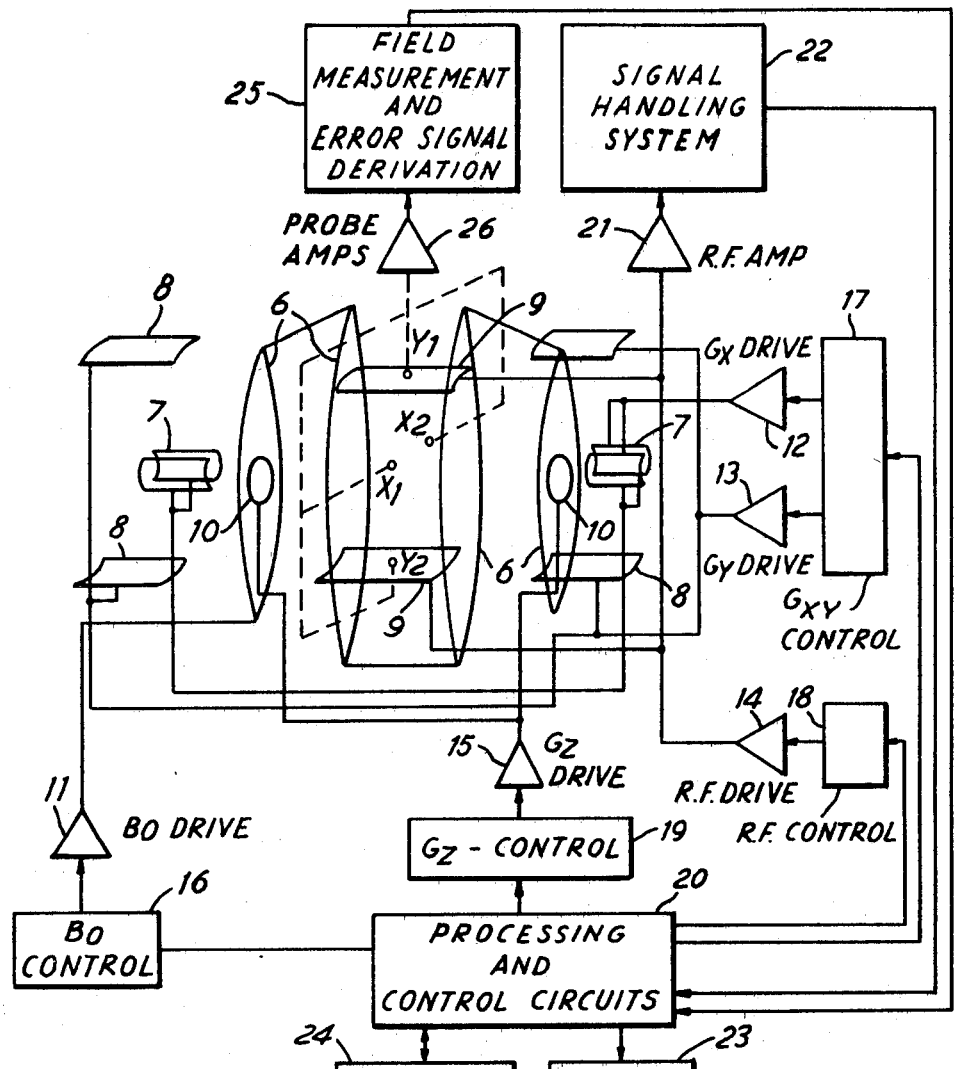
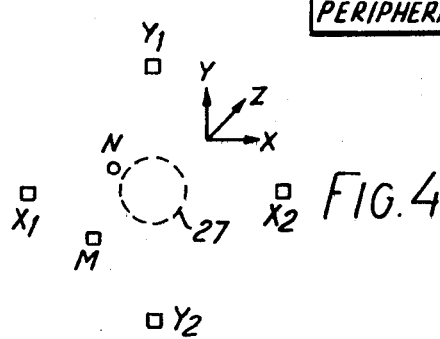
FIG.3
FIG.4

NUCLEAR MAGNETIC RESONANCE SYSTEMS

The present invention relates to systems for examining a body, in particular for examination of the body of a patient for medical purposes by means of Nuclear Magnetic Resonance (NMR) techniques.

In the specification of U.S. Pat. No. 4,254,778 which is hereby incorporated in the present specification by reference, there is described a method of examining a body by NMR, to determine a distribution of an NMR related quantity of interest in the body, and an apparatus for carrying out the method. In this method a uniform magnetic field is applied to the body throughout the examination and in conjunction therewith a sequence of other fields are applied. Initially there is applied a field having a gradient in one direction to give, taking the steady field into account, a particular field value in a cross-sectional slice of the body. Then a periodic (RF) field at the Larmor frequency for that slice is applied to cause resonance therein. Subsequently other fields are applied to provide analysable NMR signals which are used to evaluate the chosen quantity.

One noteworthy feature of the disclosure of said patent specification concerns phase dispersion in the selected slice. It is disclosed that although the resonant frequency is nominally the same throughout the slice selected (namely the Larmor frequency), there is an element of phase dispersion introduced because the excitation took place in a field gradient. It was proposed that this phase dispersion should be reduced by applying, immediately after slice selection, a further field gradient which is negative with respect to and a fixed proportion (about 55%) of the first gradient.

While this procedure is successful it has been found that when relatively large and slow slice selection pulses are used, as is sometimes preferred, there is a danger of the dephasing due to inhomogeneities in the uniform magnetic field becoming significant during the phase correction procedure which can result in a loss of image integrity. It is an object of this invention to provide an alternative phase correction procedure for which this disadvantage is reduced.

According to the invention there is provided a method of examining a slice of a body by nuclear magnetic resonance, the method including: applying to the body a steady magnetic field along an axis therein; applying a gradient magnetic field which, in conjunction with the steady field, gives a predetermined magnetic field in said slice of the body; in conjunction with the gradient field applying a periodic magnetic field at the Larmor frequency for the predetermined field in the slice to cause resonance therein; and subsequently sensing resonance signals in the presence of further fields and using them to evaluate said slice, wherein the periodic field is applied in first and second distinct pulses, each in conjunction with said gradient field, the total field integral of the periodic field being sufficient to rotate the spin vectors of nuclei in the field through an angle of $\pi/2$ radians and between the first and second pulses there is applied a further pulse of the periodic field applied in the absence of the gradient magnetic field, of field integral sufficient to rotate the spin vectors through an angle of $\pi$ radians.

Preferably the said first and second periodic field pulses are of substantially equal integral.

The invention also embraces an apparatus adapted to implement the said method.

In order that the invention may be clearly understood and readily carried into effect an example thereof will now be described with reference to the accompanying drawings of which:

FIGS. 1a and 1b illustrate a pulse sequence described in said U.S. Pat. No. 4,254,778;

FIGS. 3 shows a NMR apparatus capable of implementing this invention;

FIG. 4 shows a distribution of field sensing probes for the apparatus of FIG. 3

The examination as described in said U.S. Pat. No. 4,254,778 is achieved by applying, via appropriate coils, the sequence of field pulses shown in FIG. 1a. FIG. 1b shows the effect which each pulse has on the spin vector of a typical nucleus in the examined slice. It will be appreciated that the RF ($H_1$) field is effectively rotating about the z-axis where x, y and z are three orthogonal axes in the body being examined.

The steady field is in the z-direction and will be called $B_o$. All other fields, except the RF($H_1$) field are also in the z-direction. The slice selecting gradient field has a gradient in the z-direction and is identified as $G_z$ while other gradient fields used in the examination procedure are in the z direction with a gradient in a variable direction (R) or are organised to give phase or frequency shifts in the xy plane of suitable form. The nett gradient of whatever form is described as $G_R$. Correspondingly the spin vectors thereafter precess about the z-axis. However, for clarity of explanation the spin vectors are shown in FIG. 1b on a coordinate system which rotates with $H_1$.

Figure 1A:
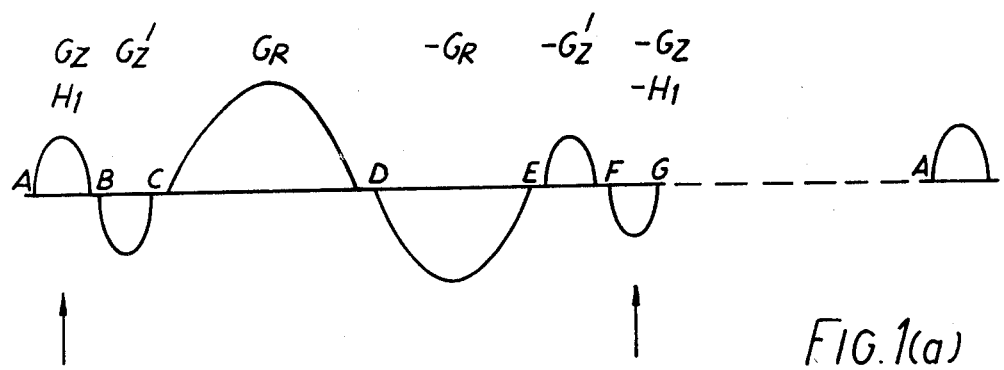
Figure 1B:
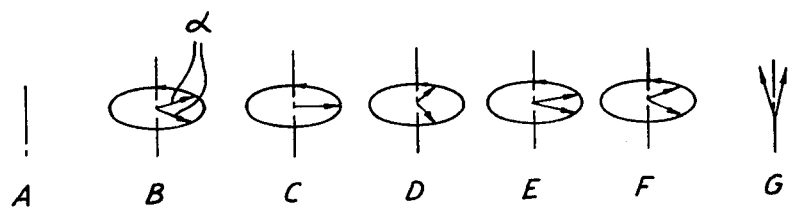

Referring to FIGS. 1a and 1b together, the examining field pulse cycle comprises six phases, AB to FG, and a recovery period shown by the broken line. The $B_o$ field is continuously present throughout the cycle.

Prior to the first pulse, or after the recovery period if an earlier cycle has been implemented, the mean spin moments are substantially aligned with the z-axis as shown at A in FIG. 1b.

The gradient field $G_z$ pulse and $H_1$ pulses (AB), simultaneously applied, respectively select the slice and bring the resultant spin moments into the xy plane (still, of course, precessing about the z-axis). Although the resonant frequency is the same throughout the slice selected, there is, as discussed hereinafter, a phase dispersion introduced because the excitation occurred in a field gradient. Thus the spin moments are as shown at B in FIG. 1b though dispersed between limits much greater than can be satisfactorily illustrated. The limits shown at B are merely indicative of the nature of the dispersion. This phase dispersion can be reversed by the application of a negative field gradient pulse $G_z'$, that is a pulse of the correct magnitude relative to $G_z$ but 180° displaced (the magnitude relation being about 55%). This pulse BC is therefore applied to bring the spin moments in the xy plane into phase as shown in part C of FIG. 1b. The $H_1$ field should not be continued into the pulse $G_z'$. It is this phase correction with which this invention is concerned but for full understanding the complete pulse sequence will be explained. It will be understood that the remainder of the sequence may be varied without departing from this invention.

After resonance has been excited a signal could be sensed to give proton density for the whole slice. However, in this sequence, the signal is sensed in the presence of a $G_R$ pulse CD which gives frequency dispersion in a selected direction (R) in the slice as previously mentioned. This frequency dispersion begins almost instantaneously with the application of the $G_R$ pulse and is maintained proportionately throughout the pulse. As described in said U.S. Pat. No. 4,254,778 the signal is sensed and frequency analysed to give the proton densities for a plurality of adjacent parallel strips of the slice. After the $G_R$ pulse, the spin moments, which are still largely in the xy plane despite some relaxation, have a considerable phase dispersion as shown in part D of FIG. 1b (which is illustrative—as the actual dispersion is $n\pi$ where n is 100 or more). At that stage, if a further cycle as described so far were to be required, it would be necessary to wait for spin-lattice relaxation to realign the spin moments adequately with the z-axis. This could take as much as 5 seconds which, since hundreds, or even several thousands of cycles (i.e. several cycles for each of a hundred or more directions of $G_R$ within a slice are required) is much too long.

To return the spin moments substantially back to the starting position (part A of FIG. 1b) the pulse sequence up to D is repeated in the reverse order and reverse sense. Since the $-G_R$ pulse is substantially the same as the $G_R$ pulse except for its sense, further signals may be detected during it. These relate to the same R direction as for the forward pulse and help to improve the signal to noise ratio.

After the reverse pulse sequence, the spin moments still show some deviation from the z axis due to phase dispersions caused by spin-spin coupling. This can not be reversed by this pulse sequence nor, it is believed, by any other. The period GA therefore allows some relaxation to thermal equilibrium (time constant $T_1$) which eliminates the effect of the phase dispersion and also reduces the effects of any mismatching between the forward and reverse pulses. Although the relaxation period GA is still necessary, the use of the reversed pulse sequence D to G much reduces that period and allows faster repetition of the total sequence for other steps in the scan progression. The length of the signal measurement period CE is influenced by the phase dispersion caused by $B_o$ field inhomogeneity and also by the dispersion caused by spin-spin coupling. If the effect of $B_o$ field inhomogeneity is considered to excessively shorten the period CE then pulse FG may be a 180° r.f. pulse rather than a 90° pulse. Turning the spin moments through 180° produces a so-called "spin-echo" of known form and the $G_R$ pulses similar to CD and DE can be repeated to give a further signal measurement period. The spin-echo procedure is known to reverse the dispersion due to inhomogeneity and can be repeated here several times until sufficient signal has been obtained or until spin-spin dispersion, which cannot be reversed, becomes excessive. As in the sequence of FIG. 1a, a spin-echo sequence should end with pulses EF, FG and recovery period GA.

In order to reduce the danger of dephasing due to inhomogeneities in $B_o$ becoming significant during $G_z'$ phase correction it is now proposed to dispense with the $G_z'$ phase correction pulse shown in FIG. 1a and to achieve the same effect by dividing the RF and $G_z$ pulses into two parts having a spin-echo ($\pi$) RF pulse between them.

Figure 2:
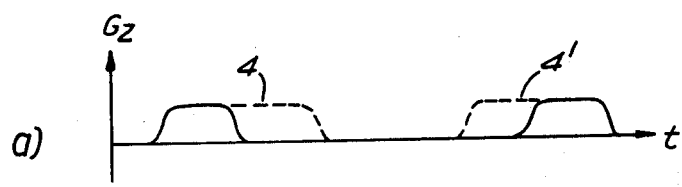
FIGS. 2a and 2b illustrate the pulse sequence of this invention.
Figure 2:
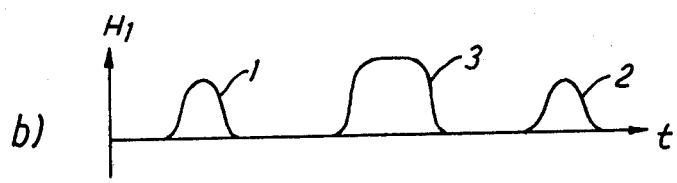

The pulse sequence of this invention is shown in FIG. 2 in which, for clarity, the gradient and RF ($H_1$) pulses have been separated onto different time axes at (a) and (b) respectively.

The RF pulse of FIG. 1a has been divided in FIG. 2 into two parts 1 and 2 whose total field integral is that of a $\pi/2$ pulse as required for the pulse sequence of FIG. 1. Each of these is applied in the presence of $G_z$ gradient pulses. Between 1 and 2 there is applied a $\pi$RF pulse 3 which in the well known manner of the spin-echo inverts the spins of the resonant nuclei. As a consequence dephasing across the slice which took place during pulse 1 will be opposed during pulse 2 because the spins are opposed in relation to the gradient.

Clearly these two dephasings will substantially balance when pulses 1 and 2 are equal as $\pi/4$ pulses, noting that 2 will need to be in fact negative because of the intermediate spin-echo pulse 3, although this is not shown in FIG. 2. However the invention is not limited to pulses 1 and 2 being $\pi/4$ pulses. In general if pulse 1 is a $\delta\pi/2$ pulse then pulse 2 should be $(1-\delta)\pi/2$ where the maximum correction is obtained as $\delta \to \frac{1}{2}$.

Ideally the gradient $G_z$ need only be applied as in full line in FIG. 2 during pulses 1 and 2. It may readily be extended as at 4 and 4' in broken line avoiding the pulse 3. In fact periods such as 4 and 4' are the equivalent of the rephasing pulses $G_z'$ and the ratio of 4:4' (or of course 1:2) can be adjusted to balance the fact that the effective phase difference caused by identical RF pulses is different for spins which have their magnetization vector at different angles to the z axis.

This invention may be implemented on a suitable NMR examining apparatus such as that disclosed in UK Patent Application No. 1,584,948 which is shown in simplified form in FIG. 3. Illustrated schematically only are: coils 6, which provide the steady $B_o$ field; 7, which provide a $G_x$ field gradient and 8 which provide a $G_y$ field gradient together forming the $G_R$ gradient of FIG. 1; 9, which provide the RF fields; and 10, which provide the $G_z$ field gradient. The coils are driven by $B_o$ $G_x$, $G_y$, RF and $G_z$ drive amplifiers 11, 12, 13, 14 and 15 respectively, controlled by $B_o$, $G_{xy}$, RF and $G_z$ control circuits 16, 17, 18 and 19 respectively. These circuits can take suitable forms which will be well known to those with experience of NMR equipment and other apparatus using coil induced magnetic fields. The circuits are controlled by a central processing and control unit 20 to achieve a desired pulse sequence such as that of this invention.

The NMR signals subsequently sensed are received in this example by the RF coils 9 and are amplified by an RF amplifier 21 before being applied to signal handling circuits 22. In certain circumstances it may be preferable to provide separate coils specifically designed for the purpose, to sense the signal. The circuits 22 are arranged to make any appropriate calibrations and corrections but essentially transmit the signals to the processing circuits to provide the required representation of the examined slice. These circuits can conveniently be combined with the circuits which control the pulse sequence and thus are included in the circuits indicated at 20. The information thus obtained can be displayed on a display 23, such as a television monitor, and this may include inputs and other peripherals 24 for the provision of commands and instructions to the machine, or other forms of output.

The apparatus also includes field measurements and error signal circuits 25 which receive signals via amplifiers 26 from field probes $X_1$, $X_2$, $Y_1$, and $Y_2$, shown. The positions of the probes, in relation to the examined slice of the body 27 of the patient, are further shown in FIG. 4. $X_1$, $X_2$, $Y_1$ and $Y_2$ are in this example simply miniature cells of pure, or slightly doped water (such as a closed test tube) surrounded by a small coil. Preferably the water is doped to have a suitable value of the spin-lattice relaxation time-constant $T_1$. The probes give a reliable resonance of 4.26 kHz/Oe. Other types of probe may be used as desired.

Figure 5:
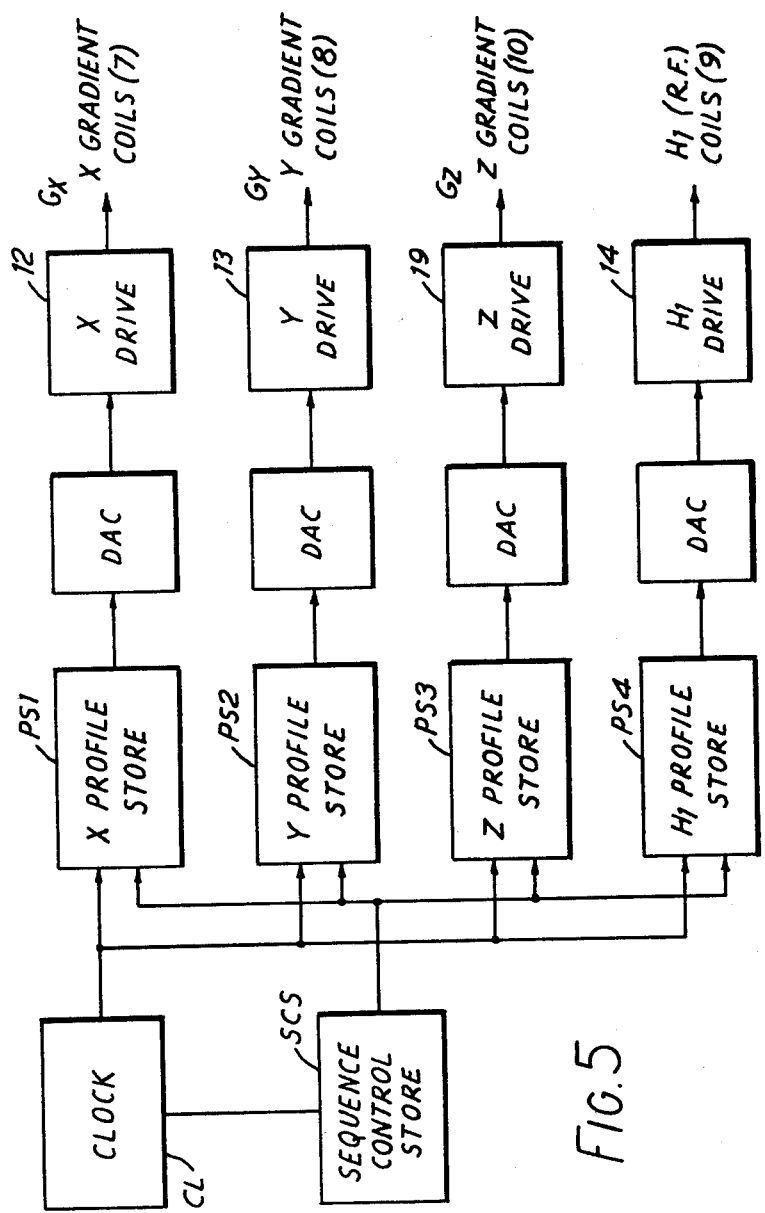
FIG. 5 illustrates the circuits for applying pulses to the field coils of FIG. 3.

FIG. 5 shows, in schematic view, components which may typically form part of the processing and control circuits 20 of FIG. 3. Four profile stores PS1-4 store the required pulse shapes in terms of a sequence of current amplitudes and the required duration (number of clock pulses) at each amplitude. The specified current at any instant is then supplied by the corresponding drive circuit (12, 13, 15 or 14) to the corresponding coil (7, 8, 10 or 9). The operation of the four profile stores is controlled by a sequence control store SCS which stores the sequence of activation of the profile stores and the duration (number of clock pulses) of operation of each stage of the sequence (including gaps in the pulse sequence). A clock CL controls the overall timing operation of the circuits.

Clearly this invention may be implemented by appropriately storing in the profile and sequence control stores information about the field pulses of FIG. 3. Other implementations are, of course, possible within the scope of the invention.

I claim:

1. A method of examining a slice of a body by nuclear magnetic resonance, said method comprising the steps of:
   (a) applying to the body a steady magnetic field along an axis therein;
   (b) applying a first gradient magnetic field which, in conjunction with the steady field, gives a predetermined magnetic field in said slice of the body;
   (c) in conjunction with the first gradient field, applying a periodic magnetic field at the Larmor frequency for the predetermined field in the slice to cause resonance therein, and
   (d) subsequently sensing resonance signals in the presence of a further gradient magnetic field and using said resonance signals to evaluate said slice, wherein the periodic field is applied in first and second distinct pulses, each in conjunction with said first gradient field, the total field integral of the periodic field being sufficient to rotate the spin vectors of nuclei in the slice through an angle of $\pi/2$ radians and between the first and second pulses there is applied a further pulse of the periodic field applied in the absence of the first gradient magnetic field, of field integral sufficient to rotate the spin vectors through an angle of $\pi$ radians.

2. The method of claim 1 in which said first and second periodic field pulses are of substantially equal integral.

3. The method of claim 1 or 2 in which said first gradient magnetic field is applied only during said first and second pulses.

4. The method of claim 1 or claim 2 in which said first gradient magnetic field is applied during the said first pulse and for a first time period afterwards, and for a second time period immediately before the occurrence of said second pulse and for the duration of said second pulse.

5. A method of examining a slice of a body by nuclear magnetic resonance, said method comprising the steps of:
   (a) applying to the body a steady magnetic field along an axis therein;
   (b) applying a first gradient magnetic field which, in conjunction with the steady field, gives a predetermined magnetic field in said slice of the body;
   (c) in conjunction with the first gradient field, applying a periodic magnetic field at the Larmor frequency for the predetermined field in the slice to cause resonance therein;
   (d) subsequently sensing resonance signals in the presence of a second gradient magnetic field and using said resonance signals to evaluate said slice, wherein the periodic field is applied in first and second distinct pulses, each in conjunction with said first gradient field, the total field integral of the periodic field being sufficient to rotate the spin vectors of nuclei in the slice through a desired angle and between the first and second pulses there is applied a further pulse of the periodic field applied in the absence of the first gradient magnetic field, of a field integral sufficient to rotate the spin vectors through an angle of $\pi$ radians.

6. A method of examining a slice of a body by nuclear magnetic resonance, said method comprising the steps of:
   (a) applying to the body a steady magnetic field along an axis therein;
   (b) applying a first gradient magnetic field which, in conjunction with the steady field, gives a predetermined magnetic field in said slice of body;
   (c) in conjunction with the first gradient field, applying a periodic magnetic field at the Larmor frequency for the predetermined field in the slice to cause resonance therein, said periodic field being applied in first and second distinct pulses, each in conjunction with said first gradient field, the total field integral of the periodic field being sufficient to rotate the spin vectors of nuclei in the slice through a desired angle;
   (d) applying, between said first and second pulses an intermediate pulse of the periodic field, while temporarily removing the first gradient magnetic field, said intermediate pulse being of field integral sufficient to rotate the spin vectors through an angle of $\pi$ radians;
   (e) producing a second gradient magnetic field;
   (f) producing resonance indicating signals during application of said second gradient magnetic field, and
   (g) utilizing said resonance indicating signals to evaluate said slice.

7. A system for examining a slice of a body by use of nuclear magnetic resonance, said system comprising:
   (a) a first source for applying to the body a steady magnetic field along an axis therein;
   (b) a second source for applying a first gradient magnetic field which, in conjunction with said steady field, gives a predetermined magnetic field in said slice of the body;
   (c) a third source for applying, in conjunction with the first gradient field, a periodic magnetic field at the Larmor frequency for the predetermined field in the slice to cause resonance therein;
   (d) means for subsequently sensing resonance signals in the presence of a second gradient magnetic field and utilizing said resonance signals to evaluate the slice, said periodic field being applied in first and second discrete pulses, each in conjunction with said first gradient field, the total field integral of the periodic field being sufficient to rotate the spin vectors of nuclei in slice through a desired angle and between the first and second pulses there is applied a further pulse of the periodic field applied in the absence of the first gradient magnetic field, of a field integral sufficient to rotate the spin vectors through an angle $\pi$ radians.

8. A system for examining a slice of a body by nuclear magnetic resonance, said system comprising:
(a) a first source for applying to the body a steady magnetic field along an axis therein;
(b) means for applying a first gradient magnetic field which, in conjunction with the steady field, produces a predetermined magnetic field in said slice of the body;
(c) a source for producing, in conjunction with the first gradient field, a periodic field at the Larmor frequency for said predetermined field in the slice to cause resonance within the slice, said periodic field source applying said periodic field in first and second discrete pulses, each pulse in conjunction with said first gradient field, the total field integral of the periodic field being sufficient to rotate the spin vectors of nuclei in the slice through a desired angle;
(d) means associated with said periodic field source for applying, between said first and second periodic field pulses, an intermediate pulse of the periodic field, while temporarily removing the first gradient magnetic field, said intermediate pulse being of field integral sufficient to rotate the spin vectors through an angle of $\pi$ radians;
(e) means for producing a second gradient magnetic field;
(f) a detector for producing resonance indicating signals during application of said second gradient magnetic field, and
(g) interpretive means for utilizing said resonance indicating signals to evaluate a characteristic of said slice.

* * * * *

UNITED STATES PATENT AND TRADEMARK OFFICE
CERTIFICATE OF CORRECTION

PATENT NO. : 4,454,474
DATED      : June 12, 1984
INVENTOR(S) : Ian R. Young

It is certified that error appears in the above—identified patent and that said Letters Patent is hereby corrected as shown below:

Column 7, line 11, before "$\pi$", add --of--.

Signed and Sealed this

Nineteenth Day of February 1985

[SEAL]

Attest:

DONALD J. QUIGG

Attesting Officer     Acting Commissioner of Patents and Trademarks